(12) United States Patent
Oh et al.

(10) Patent No.: US 8,593,901 B2
(45) Date of Patent: Nov. 26, 2013

(54) DATA WRITE TRAINING METHOD

(71) Applicants: Tae-Young Oh, Seoul (KR); Young-Soo Sohn, Seoul (KR); Seung-Jun Bae, Hwaseong-si (KR); Kwang-Il Park, Yongin-si (KR)

(72) Inventors: Tae-Young Oh, Seoul (KR); Young-Soo Sohn, Seoul (KR); Seung-Jun Bae, Hwaseong-si (KR); Kwang-Il Park, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/868,425

(22) Filed: Apr. 23, 2013

(65) Prior Publication Data

US 2013/0235683 A1  Sep. 12, 2013

Related U.S. Application Data

(62) Division of application No. 13/270,710, filed on Oct. 11, 2011, now Pat. No. 8,437,216.

(30) Foreign Application Priority Data

Oct. 11, 2010 (KR) .......................... 10-2010-0098794

(51) Int. Cl.
*G11C 8/00* (2006.01)
(52) U.S. Cl.
USPC .... 365/233.1; 365/191; 365/201; 365/185.28
(58) Field of Classification Search
USPC .......................... 365/233.1, 191, 201, 185.28
See application file for complete search history.

(56) References Cited

U.S. PATENT DOCUMENTS

| 7,415,569 | B2 | 8/2008 | Dietrich et al. |
| 7,588,979 | B2 | 9/2009 | Song et al. |
| 2009/0059693 | A1* | 3/2009 | Bae et al. ...................... 365/193 |
| 2009/0322770 | A1 | 12/2009 | Bae |

FOREIGN PATENT DOCUMENTS

KR   10-2010-0003081 A   1/2010

* cited by examiner

*Primary Examiner* — Jason Lappas
(74) *Attorney, Agent, or Firm* — Lee & Morse, P.C.

(57) ABSTRACT

Embodiments may be directed to a method of operating a semiconductor device, the method including receiving a first write training command, receiving a first write data responsive to the first write training command through a first data line, and transmitting the first write data through a second data line. Transmitting the first write data is performed without an additional training command.

3 Claims, 14 Drawing Sheets

FIG. 2
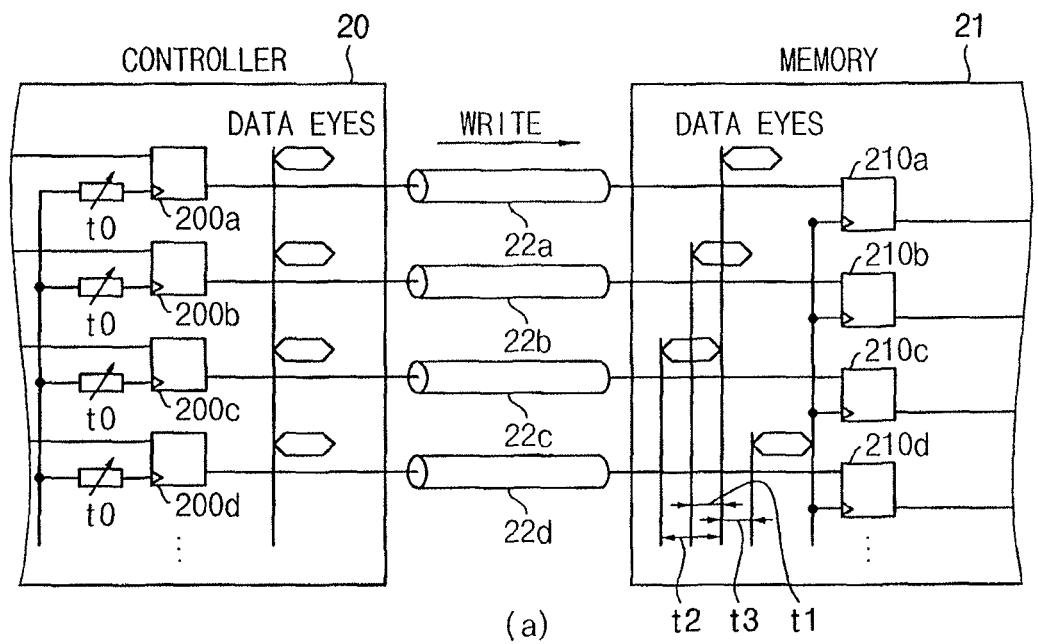
(a)
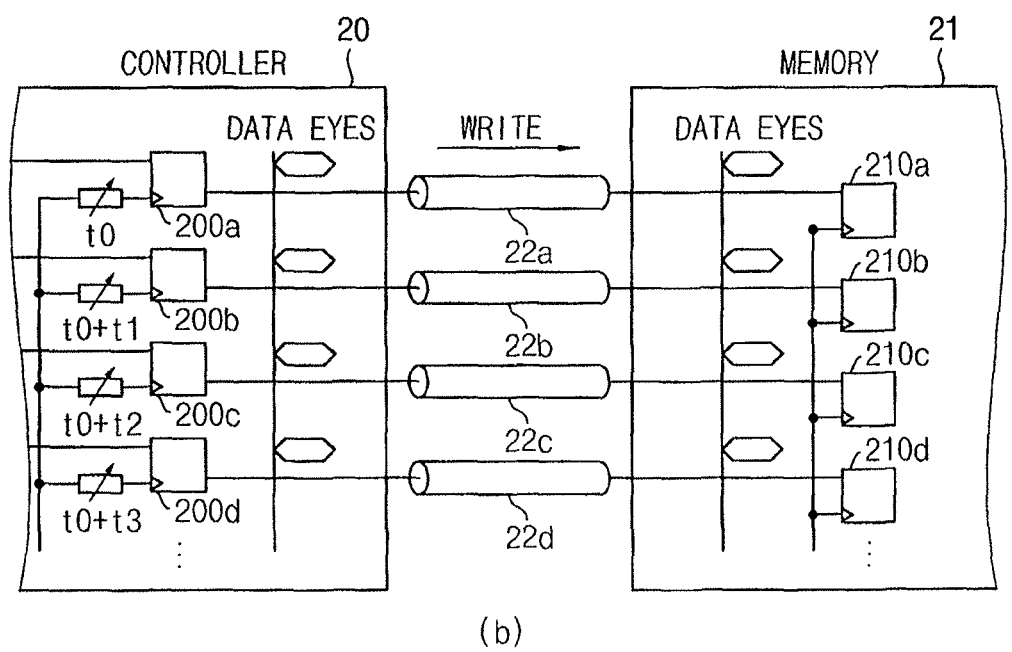
(b)

DATA WRITE TRAINING METHOD

CROSS-REFERENCE TO RELATED APPLICATIONS

This is a divisional application based on pending application Ser. No. 13/270,710, filed Oct. 11, 2011, the entire contents of which is hereby incorporated by reference.

This application claims priority to Korean Patent Application No. 10-2010-0098794, filed on Oct. 11, 2010, the entire contents of which are incorporated herein by reference.

BACKGROUND

1. Technical Field

Embodiments relate to a semiconductor device and a data training method thereof.

2. Related Art

In a processing unit of a chipset that requires a high-speed data processing, a write training operation is performed to secure stability of the data processing before general data processing is performed.

SUMMARY

According to an embodiment, a method of operating a semiconductor memory device comprises receiving a first write training command, receiving a first write data responsive to the first write training command through a first data line, and transmitting the first write data through a second data line, wherein, transmitting the first write data is performed without an additional training command.

After receiving the first write data further comprises storing the first write data to a first write storage, transferring the first write data from the first write storage to a first read storage, and loading the first write data from the first read storage to the second data line.

The first data line comprises a plurality of first unit data lines, and a representative data is selected from data transmitted by the first unit data lines and transmitted through the second data line.

The representative data is a mean value of data transmitted by the first unit data lines.

The representative data is an encoded value of data transmitted by the first unit data lines.

After transmitting the write data further comprises receiving a second write training command, receiving a second write data responsive to the second write training command through the second data line, and transmitting the second write data through the first data line.

Transmitting the second write data is performed without an additional training command.

After receiving the second write data further comprises: storing the second write data to a second write storage; transferring the second write data from the second write storage to a second read storage; and loading the second write data from the second read storage to the first data line.

The second data line comprises a plurality of second unit data lines, and a representative data is selected from data transmitted by the second unit data lines and transmitted through the first data line.

The representative data is a mean value of data transmitted by the second unit data lines.

The representative data is an encoded value of data transmitted by the second unit data lines.

According to an embodiment, a method of operating a semiconductor device comprises transmitting a first data training command, transmitting a first data responsive to the first data training command through a first data line, receiving the first data through a second data line, and compensating a phase difference between data lines using the received first data.

Receiving the first data is performed without an additional data training command.

After compensating the phase difference further comprises: transmitting a second data training command; transmitting a second data responsive to the second data training command through the second data line; and receiving the second data through the first data line.

According to an embodiment, a semiconductor device comprises a first data storage configured to receive a first training data responsive to a first data training command through a first data line, and a second data storage receiving and storing the first training data from the first data storage, wherein, the first training data of the second data storage is loaded to a second data line and transmitted to outside.

Transmitting of the first training data through the second data line is performed without additional data training command.

The semiconductor device further comprises a third data storage configured to receive a second training data responsive to a second data training command through the second data line; and a fourth data storage configured to receive the second training data from the third data storage.

The second training data from the fourth storage is loaded to the first data line and transmitted to outside.

Transmitting of the second training data through the first data line is performed without additional data training command.

BRIEF DESCRIPTION OF THE DRAWINGS

The above and other features will become more apparent to those of ordinary skill in the art by describing in detail exemplary embodiments thereof with reference to the attached drawings, in which:

FIG. 2 is a diagram illustrating a write training of a memory system according to an embodiment;

DETAILED DESCRIPTION OF THE EMBODIMENTS

Example embodiments will now be described more fully hereinafter with reference to the accompanying drawings; however, they may be embodied in different forms and should not be construed as limited to the embodiments set forth herein.

Hereinafter, exemplary embodiments will be described in detail with reference to the accompanying drawings.

Figure 1:
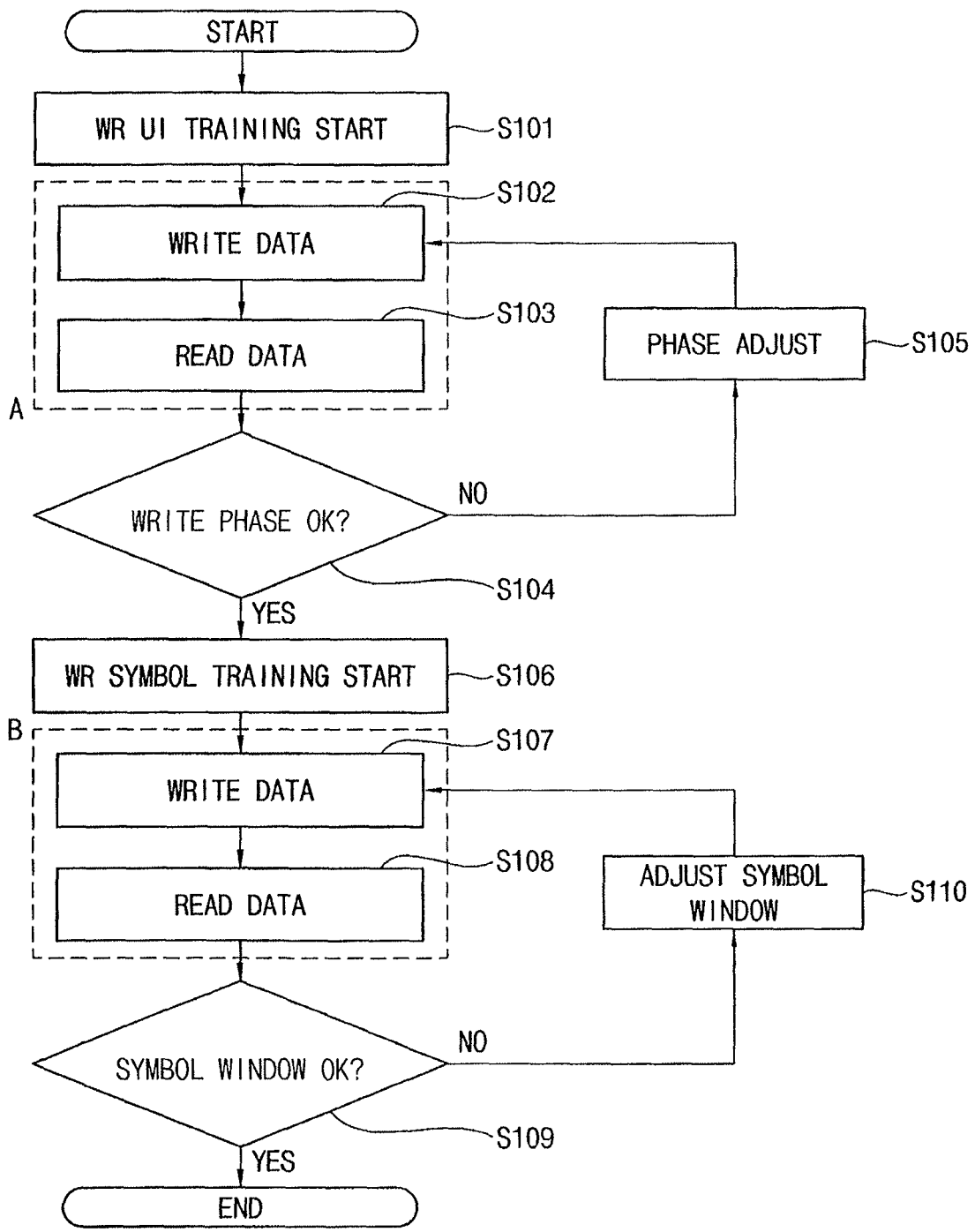
FIG. 1 is a flow chart illustrating a write training of a semiconductor device according to an embodiment.

FIG. 1 is a flow chart illustrating a write training of a semiconductor device according to an embodiment.

FIG. 1 illustrates a write training in a high speed bi-directional interface. Referring to FIG. 1, the write training may include a write UI (User Interface) training S101~S105 and a write symbol training S106~S109. The write UI (User Interface) training S101~S105 and the write symbol training S106~S109 may be executed sequentially.

In the write UI training S101~S105, for instance in a memory system, a memory controller may write a full toggling pattern to a FIFO (First In First Out) in a memory device through a channel. The memory device may keep performing the write UI training until the memory device receives the full toggling pattern. After the write UI training completes, the write symbol training S106~S109 may be performed. In the write symbol training S106~S109, for instance in a memory system, the memory controller may write a consecutive 8 or 10 bit data to the FIFO in the memory device through the channel. The memory device may keep performing the write symbol training until the memory device finds an accurate inter-symbol interval.

Hereinafter, the write training sequence may be explained more detail as an example of a graphic memory device (for instance, GDDR5 (Graphic Double Data Rate 5)). The write training may not be particularly limited to the graphic memory device. A training sequence for the graphic memory device may be included in an initialization steps. Initially an address training may be performed, and a WCK2CK (write clock (WCK) to clock (CK)) training and a read training may be performed sequentially. After the read training is performed, the write training may be performed.

Referring to FIG. 1, a write UI training may be initiated by a command (write training command) from a graphic memory controller on the course of the training sequence S101. The graphic memory controller may write a write training data to a write data storage of the graphic memory device (for instance, a write FIFO) through a channel in write latency S102. The write training data may be a full toggling pattern. The channel may include a data channel DQ I/O.

The write training data written in the write data storage may be transferred to a read data storage in the GDDR5 (for instance, a read FIFO), and may be re-transferred to (read by) the graphic memory controller through another channel S103. Another channel may include a data channel DQ I/O adjacent the DQ I/O used for the write operation. The data re-transfer may be performed through the same channel used for the write operation depending on an internal configuration of the graphic memory device. The data transfer and re-transfer process 'A' may be performed responsive to the write training command without an additional command such as a read training command. The read training command may refer to a command initiating the re-transfer process.

When the graphic memory controller initiates the additional command to read the data stored in the read data storage of the graphic memory device, a turn around time may increase. The turn around time may refer to a time period that the graphic memory controller initiates a command and the following data transfer is performed. In the present descriptions, the data stored in the read data storage of the graphic memory device may be re-transferred to the graphic memory controller automatically. This 'automatically' refers to that re-transferring of the data is performed by the write training command without the read training command. Therefore, a read latency does not need and turn around time may decrease.

The graphic memory controller may compare phase of the data respectively transferred from the channels S104. When a phase of data between channels does not match, the graphic memory controller may adjust phase of each data S105. The graphic memory device may keep performing the write UI training until the graphic memory device receives the full toggling pattern correctly. The phase adjustment may include arithmetic summation and subtraction according to the comparison. In the comparison, a data phase may be selected as a reference, and other data phases may be compared to the reference respectively. When a phase of data between channels matches, the write symbol training S106~S109 may be performed.

The write symbol training may be initiated by a command (write training command) from the graphic memory controller S106. The graphic memory controller may write a write training data to a write data storage of the graphic memory device (for instance, a write FIFO) through a channel in write latency S107. The channel may include a data channel DQ I/O.

The write training data written in the write data storage may be transferred to a read data storage in the graphic memory device (for instance, a read FIFO), and may be re-transferred to (read by) the graphic memory controller through another channel S108. Another channel may include a data channel DQ I/O adjacent the DQ I/O used for the write operation. The data re-transfer may be performed through the same channel used for the write operation depending on an internal configuration of the graphic memory device. The data transfer and re-transfer process 'B' may be performed responsive to the write training command without an additional command such as a read training command. The read training command refers to a command used for initiating the re-transfer process. In the present descriptions, the data stored in the read data storage of the GDDR5 may be re-transferred to the graphic controller automatically.

The graphic memory controller may compare a symbol window of the data respectively transferred from the channels S109. When the symbol window of data between channels does not match, the graphic memory controller may adjust the symbol window of each data S110. The graphic memory device may keep performing the write symbol window training until the symbol window of each data matches. The symbol window adjustment may include arithmetic summation and subtraction according to the comparison. In the comparison, a data symbol window may be selected as a reference, and other data symbol windows may be compared to the reference respectively. When a symbol window of data between channels matches, the write training may come to an end.

FIG. 2 is a diagram illustrating a write training of a memory system according to an embodiment.

Referring to FIG. 2, a memory system may include a memory controller 20 and a memory device 21. The memory controller 20 communicates data, address and command with the memory device 21 via channel 22a to 22d. A graphic card may be one of the exemplary embodiments of the memory system. The memory controller 20 may include flip-flops 200a to 200d. The memory device 21 may include flip-flops 210a to 210d. The flip-flops 200a to 200d and 210a to 210d may be used to control a phase of the signal in read and write training sequence. A D-flip-flop may be one of the exemplary embodiments of flip-flops 200a to 200d and 210a to 210d.

During a write training, a timing of the DQ driver in the memory controller 20 is adjusted in a way that the memory device 21 will receive DQ data eyes at their optimum fixed sampling points per DQ. As for the read training, no data transfers to/from the memory core take place during the write training. Special write training commands may direct memory device 21 to write the data into the flip-flops 210a to 210d. The flip-flops 210a to 210d may be used for the read training. The memory controller 20 reads back data from the memory device 21 sampled without an additional read training command. With the knowledge of what data was sent to the memory device 21 and what sampled data was re-transferred to the memory controller 20, the memory controller 20 can adjust its driving timing for the single DQ pins until it reads back the same data sent before.

Referring to FIG. 2 (a), each channel may have a timing difference (t1~t3) between a write clock WCK and a strobe. The memory controller 20 may detect the timing difference (t1~t3) and adjust the timing difference (t1~t3) before sending next write training data. FIG. 2 (b) shows that the timing difference (t1~t3) does not exist after the write data training.

Figure 3:
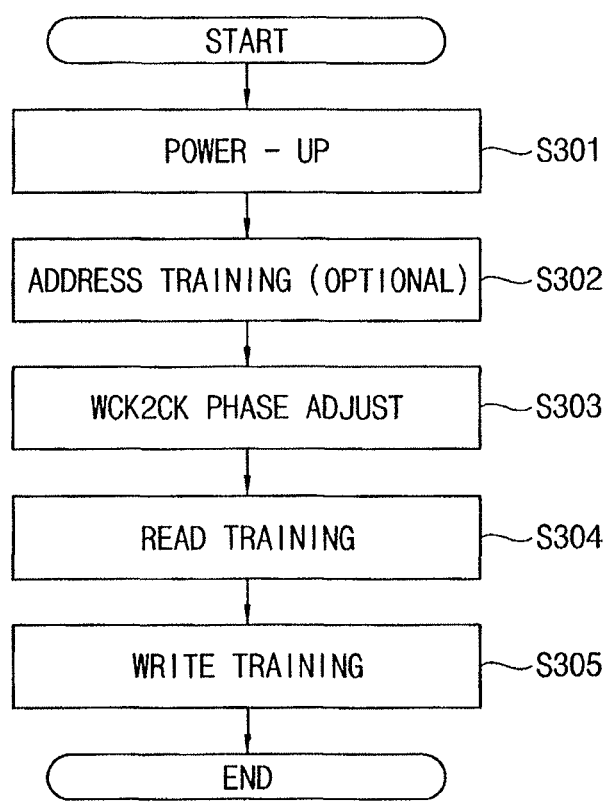
FIG. 3 is a flow chart illustrating a training sequence of a graphic memory device according to an embodiment.

FIG. 3 is a flow chart illustrating a training sequence of a graphic memory device according to an embodiment. Herein, a graphic memory device may be one the exemplary embodiments.

Referring to FIG. 3, in order to align the timing of a memory controller to the timing conditions a graphic memory device expects, the training sequence as shown FIG. 3 is performed when powering up a GDDR5 link S301.

A training sequence may be performed after the power-up S301. The Power needs to be stable and address phase needs to be aligned to have a correct recognize on command and OP-code.

The training sequence may be chosen based on the following criteria. An addressing training S302 may be performed first to allow full access to a mode resister set MRS. MRS for address training may be a special single data rate mode register set guaranteed to work without training. Address input timing may function without training as long as $t_{AS/H}$ are met at the GDDR5 SGRAM. The Address training may be an optional step during the training sequence. The address training aligns the center of the address signal data eyes generated by the graphic memory controller/ATE to the fixed CK dependant strobe timing that is valid with the graphic memory device. For the address training, a feedback loop indicating the training status to the graphic memory controller/ATE is closed by selected DQ pins. The DQ pins transmit the data sampled by the graphic memory device on the address pins to the graphic memory controller/ATE.

A WCK2CK training S303 may be performed before a read training because a shift in WCK relative CK may cause a shift in all read timings relative to CK. During the WCK2CK training (WCK phase adjustment), the rising edges of the WCK clock are aligned to the rising edges of the CK clock. Each of the two WCK is divided by two. The divided clocks then are sampled with the rising edges of the CK clock. The logical result of this sampling operation is transferred via the EDC (Error Detection Code) pins to the graphic memory controller/ATE. With such an operation, the alignment point of the rising WCK and CK edges can be identified by simply moving the WCK edges versus the CK edges and scan for a state change on the EDC pin(s).

A Read training S304 may be performed before a write training because optimal write training depends on correct read data. During the read training, the timing of the data sampling circuit in the graphic memory controller may be adjusted to match the center of the data eyes as received from the graphic memory device. In order to perform the read training, the data used for the training may be written into FIFOs of the graphic memory device via the already trained address pins. With a read training command, one data burst may be sent from the FIFOs to the DQ pins of the graphic memory device. Since the graphic memory controller knows which data to expect, it can align its sampling point per DQ pin by repeatedly performing the read training commands and analyzing the data bursts coming from the graphic memory device. The write training S305 may be performed for the final stage of the training sequence.

Figure 4:
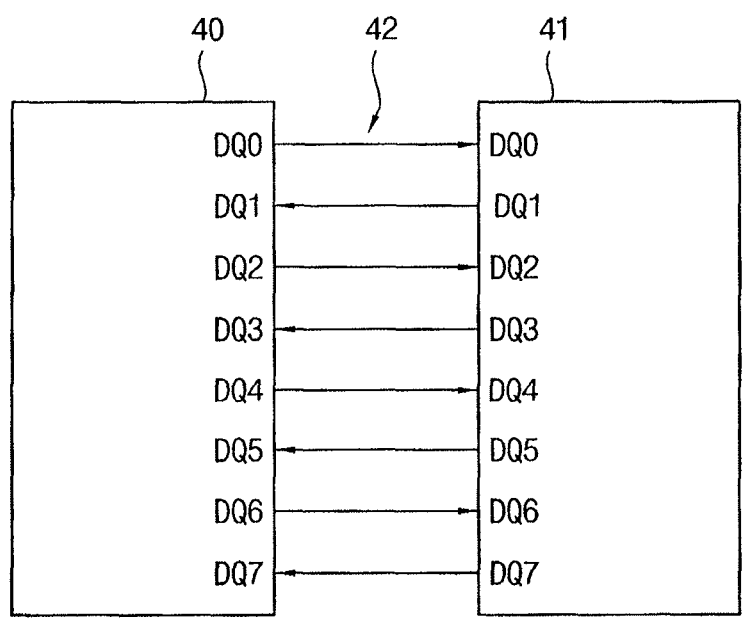
FIG. 4 is a block diagram illustrating a memory system according to an embodiment.

FIG. 4 is a block diagram illustrating a memory system according to an embodiment.

Referring to FIG. 4, the memory system may include a memory controller 40 and a memory device 41. The memory controller 40 and the memory device 41 may communicate data via channel 42. The channel 42 may include data pins DQ0~DQ7. The channel 42 may include address channel, clock channel and command channel. The channel 42 may include physical or spatial connections of pins transferring data, clock and command. Data I/Os may connect the pins DQ0~DQ7 and may include bidirectional I/O.

In the initialization sequence, it may be granted that a WCK2CK and a read data training already have been done. A write training command is transferred to memory device 41 from memory controller 40 via command channel (not shown). Hereinafter, data I/O pins (DQ0, DQ2, DQ4, DQ6) and channel 42 may be called to data I/Os DQ0~DQ7.

The memory controller 40 may transfer 4 write training data to the memory device 41 through respective data I/Os (DQ0, DQ2, DQ4, DQ6) in a write latency. The memory device 41 may store the transferred data in write data storage (not shown) and transfers the transferred data to read data storage (not shown) coupled to data I/Os (DQ1, DQ3, DQ5, DQ7) without an additional read training command. The sampled write training data (the transferred data stored in read data storage in memory device 41) are re-transferred to the memory controller 40. Data re-transferring from the memory device 41 may be performed by respectively adjacent data I/Os (DQ1, DQ3, DQ5, DQ7) for data transferring I/Os (DQ0, DQ2, DQ4, DQ6).

The memory controller 40 may figure out data skew between data I/Os (DQ0~DQ7) using the sampled write training data re-transferred from the memory device 41. The data skew in the data I/Os (DQ1, DQ3, DQ5, DQ7) for re-transferring were compensated by the read data training already. The memory controller 40 can adjust its driving timing for the single data I/Os (DQ1, DQ3, DQ5, DQ7) until it reads back the same data sent before. Above-described write data training may include a phase and a symbol window training.

In the state that the data I/Os are bi-directional, the data write training for the opposite data I/Os (DQ1, DQ3, DQ5, DQ7) may be performed. The memory controller 40 transfers 4 write training data to memory device 41 through respective data I/Os (DQ1, DQ3, DQ5, DQ7) and reads back through data I/Os (DQ0, DQ2, DQ4, DQ6) responsive to the write training command without an additional read training command.

Figure 5:
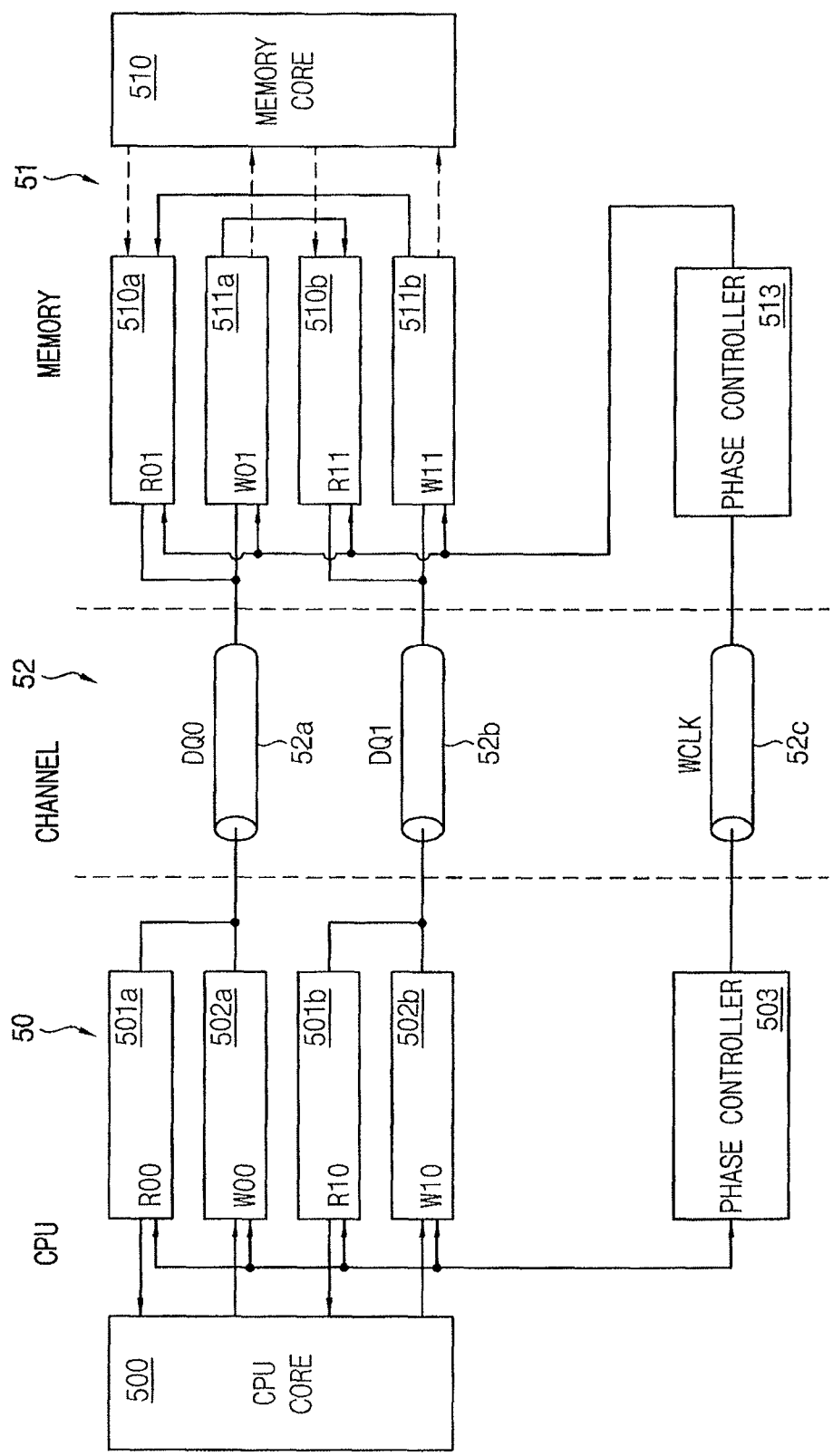
FIG. 5 is a block diagram illustrating a memory system according to an embodiment.

FIG. 5 is a block diagram illustrating a memory system according to an embodiment.

Referring to FIG. 5, a memory system includes a Central Processing Unit (also indicated as a CPU) 50 and a memory device 51. The CPU 50 may include a CPU core 500, read data storages 501a, 501b, write data storages 502a, 502b and a phase controller 503. The memory device 51 may include a memory core 510, read data storages 510a, 510b, write data storages 511a, 511b and a phase controller 513. A channel 52 may include data I/Os 52a, 52b and a write clock WCK I/O 62c. Data I/Os 52a, 52b may be constituted by various units for instance, 8 or 16 and so on. Data I/Os 52a, 52b may be bi-directional organization.

The CPU core 500 transfers write training data to the write data storage 502a. The write data storage 502a loads the write training data to the data I/O DQ0 52a such that the data I/O DQ0 52a transfers the write training data to the memory device 51. The transferred write training data may be stored in the write data storage 511a in the memory device 51. The write data storage 511a transfers the write training data to the read data storage 510b without an additional read training command. The read data storage 510b loads the write training data to the data I/O DQ1 52b such that the data I/O DQ1 52b transfers the sampled write training data to the memory controller 50. The sampled write training data may be stored in the read data storage 501b in the memory controller 50.

The phase controller 503 may compare the write training data stored in the read data storage 501b with others and calculate differences versus a reference phase and/or symbol window. The phase controller 503 can adjust optimized data eyes for each data I/O 52a, 52b by repeating the data write training sequence. The phase controllers 503, 513 in the CPU 50 and/or in the memory device 51 may perform the same operation. One of the phase controllers 503 and 513 can be omitted according to the system configuration.

Hereinafter, detailed configurations for FIG. 5 and operation may be illustrated by embodiments. In the following embodiments, the phase controller 503 in the CPU 50 may perform controlling a phase. The controlling may comprise a compare and a adjusting.

Figure 6:
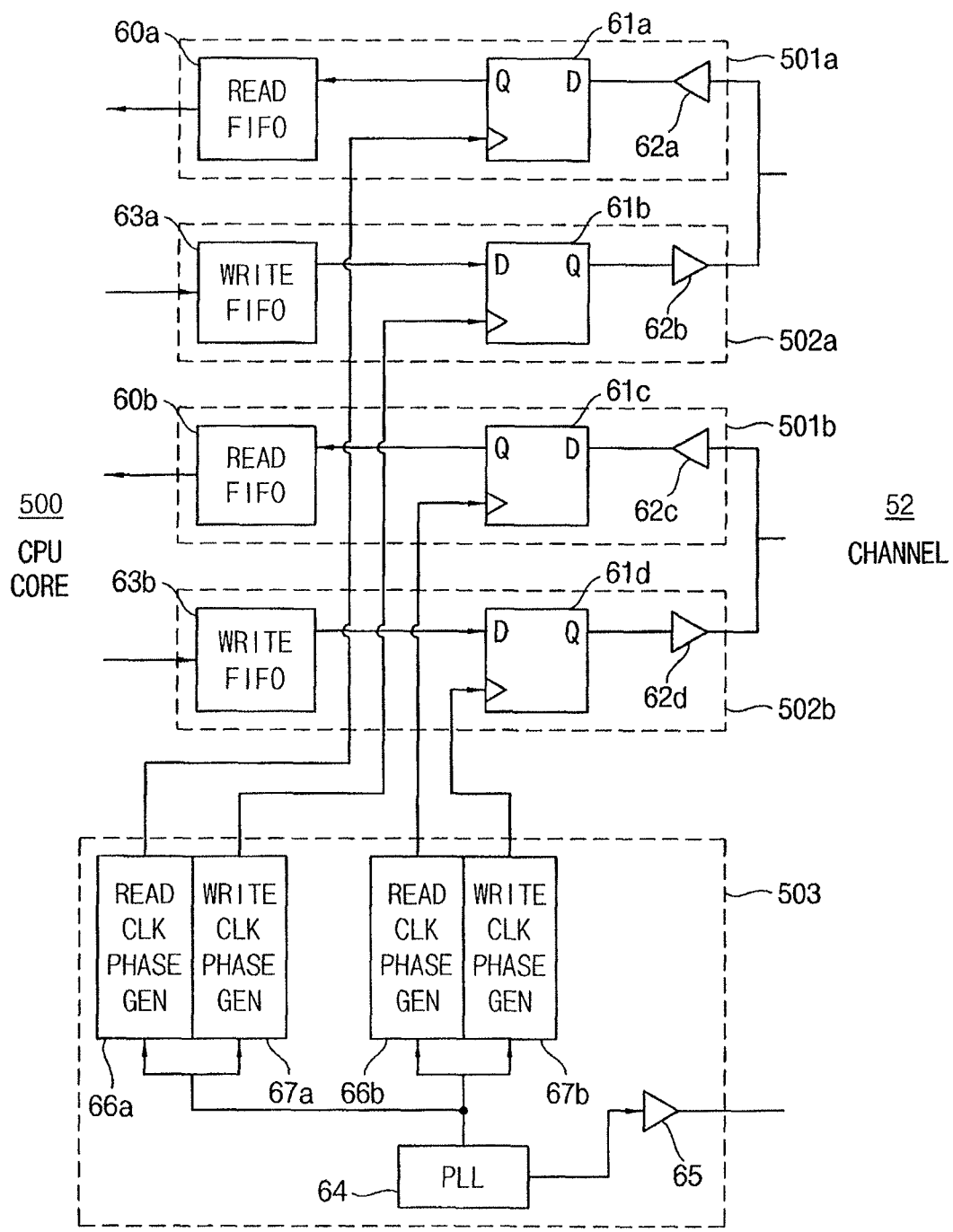
FIG. 6 is a block diagram illustrating a CPU according to an embodiment.

FIG. 6 is a block diagram illustrating a CPU according to an embodiment.

Referring to FIG. 6, a write data storage 502a may include a write FIFO 63a, a D-flipflop 61b and an input/output buffer 62b. A write data storage 502b may include a write FIFO 63b, a D-flipflop 61d and an input/output buffer 62d. A read data storage 501a may include a read FIFO 60a, a D-flipflop 61a and an input/output buffer 62a. A read data storage 501b may include a read FIFO 60b, a D-flipflop 61c and an input/output buffer 62c. Read FIFOs 60a, 60b and write FIFOs 63a, 63b may be connected to a CPU core 500 respectively for transmitting and receiving a write training data. Input/output buffers 62a-62d may connect FIFOs 61a-61d to a respective channel 52 for transmitting and receiving the write training data.

The phase controller 503 may include read clock phase generators 66a, 66b, write clock phase generators 67a, 67b, a PLL 64 and a buffer 65. The phase controller 503 may include pair of the clock phase generators 66a/67a and 66b/67b respectively coupled to the I/O configurations of the data storages 501a/502a and 501b/502b.

The phase controller 503 may use a phase interpolation method to control the write data eyes for training. The phase interpolation method may control data eyes by adjusting phase of a strobe signal WCK (write clock) related to training data of each channel. The PLL 64 generates clock signals having constant intervals. Adjacent clock signals may be interpolated such that clock signals having fine intervals may be generated by the phase controller 503. The clock signals having fine intervals may be supplied to each D-flipflop 61a-61d. The D-flipflops 61a-61d may use the clock signals to finely adjust sampling timing of read or write training data.

The CPU 50 may include phase detector (not shown). The write training data from each I/O may be re-transferred and stored read FIFOs 60a, 60b. The CPU 50 may compare phase or symbol window of the data stored in the FIFOs 60a, 60b using the phase detector. The CPU 50, then may control read clock phase generators 66a, 66b and write clock phase generators 67a, 67b according to the compared results. The CPU 50 may repeat the control in every training time and store a data output timing when skew compensation completes for each channel 52. In normal operation, write data may be output according to the adjusted timing by the data write training sequence. The phase controller 503 can use an oversampling method to control the write data eyes for the data write training.

Figure 7:
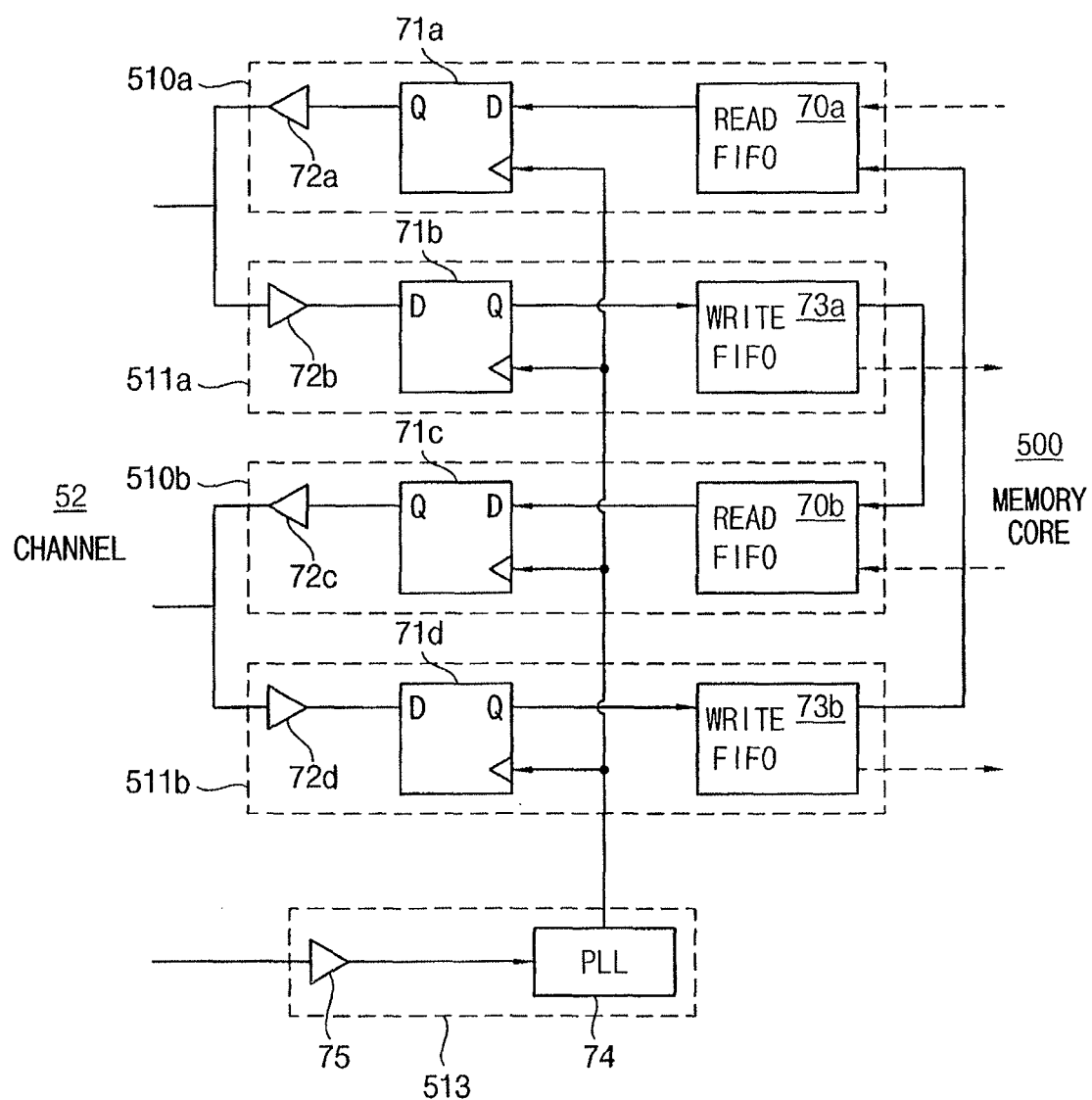
FIG. 7 is a block diagram illustrating a memory device according to an embodiment.

FIG. 7 is a block diagram illustrating a memory device according to an embodiment.

Referring to FIG. 7, the memory device 51 may include write data storages 511a and 511b, read data storages 510a and 510b and a phase controller 513.

The write data storage 511a includes an input/output buffer 72b, a D-flip-flop 71b and a write FIFO 73a. The write data storage 51ba includes an input/output buffer 72d, a D-flipflop 71d and a write FIFO 73b. The read data storage 510a includes an input/output buffer 72a, a D-flipflop 71a and a read FIFO 70a. The Read data storage 510b includes an input/output buffer 72c, a D-flipflop 71c and a read FIFO 70b. D-flipflops 71a~71d may be changeable to RS-flipflop, T-flipflop and so on.

Write training data may be transferred by the channel 52 and input to the input/output buffers 72b and 72d. The input write training data may be transferred to the D-flipflops 71b and 71d. Write FIFOs 73a and 73b input the write training data from respective D-flipflops 71b and 71d and store the write training data respectively. The stored write training data may be transferred to respectively adjacent read FIFOs 70a and 70b without an additional read training command. The write training data in read FIFOs 70a and 70b (sampled write training data) may be loaded to channel 52 through respective D-flipflops 71a, 71c and input/output buffers 72a, 72c. The loaded write training data may be re-transferred to CPU through the channel 52. The CPU may perform comparing/detecting/adjusting skew of the phase or window symbol of the sampled write training data consequently during the write training sequence.

The phase controller 513 may include a PLL (Phase Locked Loop) 74 and a buffer 75. The PLL 74 may be changeable to DLL (Delay Locked Loop). The phase controller 503 (located in the memory controller 50 in FIG. 6) adjusts data eyes using the phase interpolation method. The phase controller 513 may adjust data sampling timing of D-flipflops 71a~71d using the write clock WCK as a source transferred through the channel 52.

The sampled write training data may be re-transferred to the memory controller 50 through an adjacent data I/O (channel 52) in FIG. 7. The Data transferring path may be respectively added to transfer data from write FIFOs 73a, 73b to adjacent read FIFOs 70a, 70b.

The sampled write training data may be re-transferred to the memory controller 50 through the same data I/O (channel)

in transferring. The data transferring path may be respectively added to transfer data from write FIFOs 73*a*, 73*b* to read FIFOs 70*a*, 70*b* coupled to same data I/O.

Figure 8:
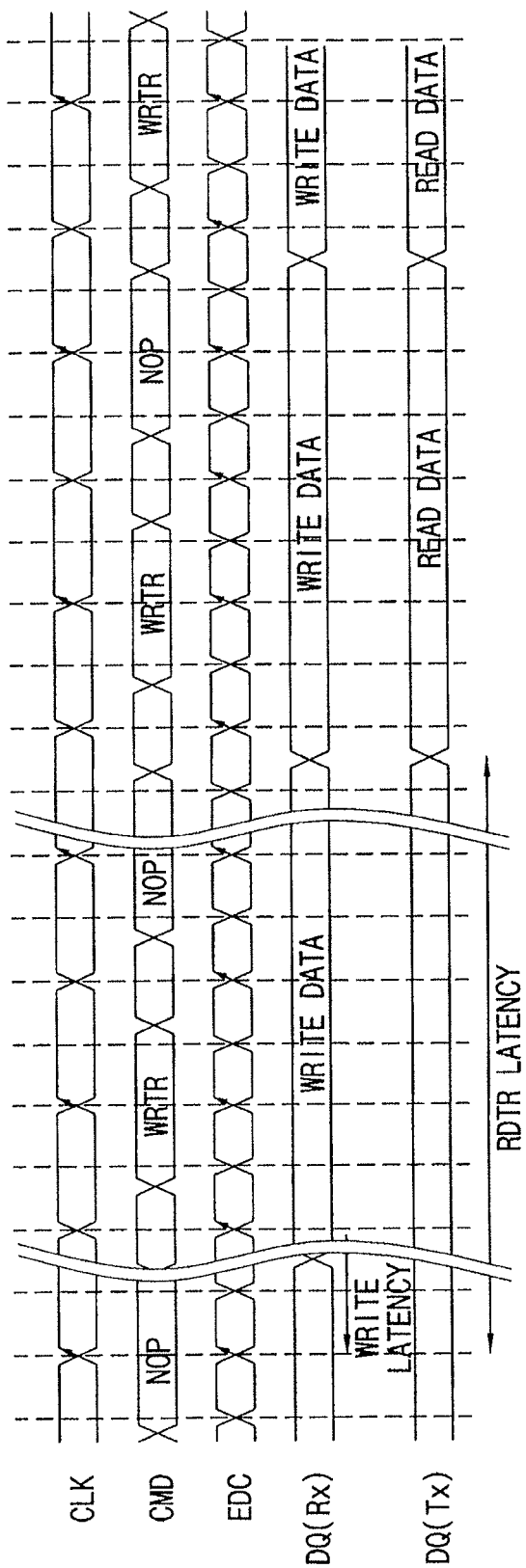
FIG. 8 is a timing diagram illustrating a write training of a semiconductor device according to an embodiment.

FIG. 8 is a timing diagram illustrating a write training of a semiconductor device according to an embodiment.

Referring to FIG. 8, a write UI or a symbol window training may be initiated by a write training command WRTR from a memory controller. The memory controller may supply a write training data WRITE DATA to a memory device in write latency WRITE LATENCY. Consecutive write training commands WRTR may be initiated by the memory controller without an additional read training command.

After read data training latency RDTR LATENCY from the write data training command WRTR initiation, sampled write training data (read training data READ DATA) may be re-transferred to the memory controller from the memory device.

Both write training data WRITE DATA and read training data READ DATA may be used for the same write data training sequence. The Read training data READ DATA may be a sampled write training data. Write training data WRITE DATA and read training data READ DATA may be respectively transferred and re-transferred being aligned to the write clock WCK.

In a graphic memory device, the write clock may have double clock frequency of a clock signal. The write clock WCK may be transferred through WCK/WCK# pins on a channel between a memory controller and a memory device. Intervals between consecutive write data training may be 2tCK (2 periods of clock signal). Intervals between consecutive write data training may be 4tCK in bidirectional I/Os.

In above-described embodiment, the memory device may re-transfer the sampled write training data. The memory device may process the sampled write training data and find skew. When finding skew, the memory device may transfer the result to the memory controller.

Figure 9:
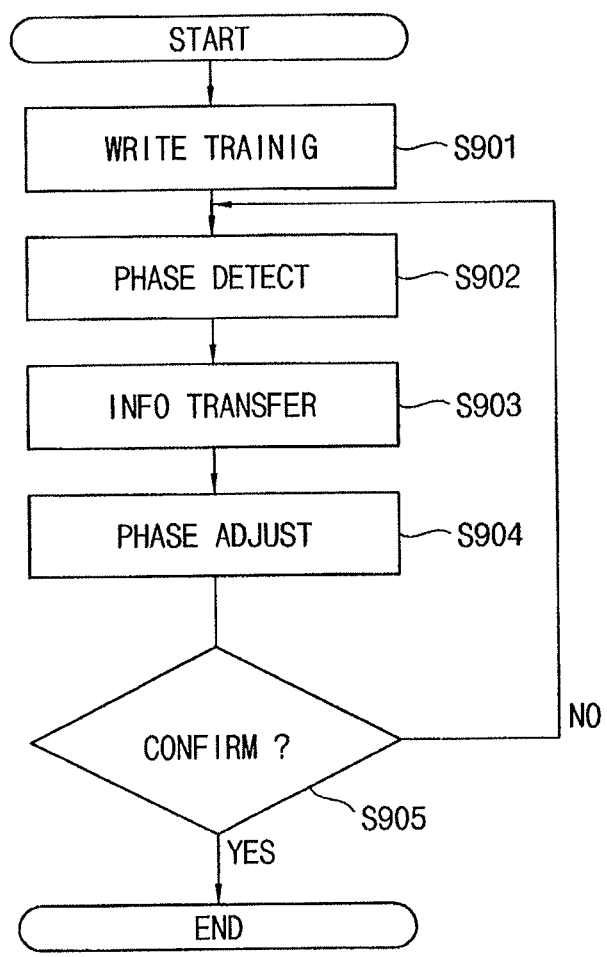
FIG. 9 is a flow chart illustrating a write training of a semiconductor memory device according to an embodiment.

FIG. 9 is a flow chart illustrating a write training of a semiconductor memory device according to an embodiment. A memory device may process a sampled write training data to find skew and transfer the result to a memory controller.

Referring to FIG. 9, a write training starts responsive to a write training command from the memory controller S901. The write training may be a write data training, included in an initialization sequence of the memory device. The write training may be initiated by periodically or abruptly. Commands may be abruptly generated by real time detection and decision of channel skews. The write training may include a write UI training and/or a write symbol window training.

In write latency from the initiation of the write training command, write training data may be stored in a write data storage of the memory device. The memory device may respectively compare stored write data per data I/Os with a write clock WCK and detect phase information using a phase detector S902. Detected phase information may be supplied for the memory controller S903. Phase information may be transferred through a data I/O, a C/A (Command/Address) I/O, a EDC (Error Detection Code) I/O and an additional I/O.

The memory controller may adjust (compensate) data skew between channels using the phase information S904. When the memory controller completes the adjustment, the write training may come to an end. After phase adjustment, an additional confirmation process may be performed S905.

Figure 10:
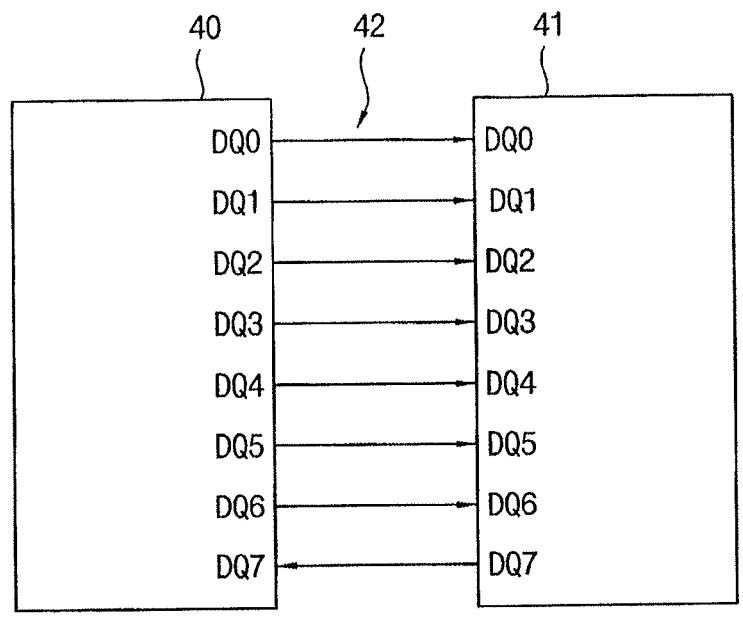
FIG. 10 is a block diagram illustrating a memory system according to an embodiment.

FIG. 10 is a block diagram illustrating a memory system according to an embodiment.

Referring to FIG. 10, a memory system may include a memory controller 40 and a memory device 41. The memory controller 40 and the memory device 41 communicate data via a channel 42. The channel 42 may include data pins DQ0~DQ7. The channel 42 may include address channel, clock channel and command channel. The channel 42 may include physical or spatial connections of pins for transferring data, clock and command. Data I/Os connecting the pins DQ0~DQ7 may include bidirectional I/O.

In per-pin skew compensation in FIG. 4, write training data may be transferred from the memory controller 40 to the memory device 41 via half of the channels 42 and be re-transferred from the memory device 41 to the memory controller 40 via rests of the channel 42.

After the write training for the half comes to an end, that of the rest channel 42 may be performed. An initiation of the write training for the rest channel 42 may be started from a mode change. The mode change may be controlled by MRS (Mode Register Set). Above-described per-pin skew compensation may be suitable for an initialization step since it takes longer time than CDR (Clock Data Recovery). The CDR has been applied to read training for graphic memory device. After an initial write data training, channel skews can be changed by a temperature, an operating voltage and other factors. Channel skew variation may be regarded as it has a constant direction since initially compensated. The skew variation may be compensated using representative I/Os. Representative I/Os may be allocated per byte or designated bits.

Referring to FIG. 10, the memory controller 40 may transfer write training data via 7 data I/Os DQ0~DQ6. The memory device 41 may transfer 1 representative data of the 7 data via the data I/O DQ7. The representative data may be one or more data and may include selected data or processed data from the transferred 7 data. The memory controller 40 may adjust skews of data I/Os DQ0~DQ7 with reference to the information re-transferred by the data I/O DQ7. Representative data I/O DQ7 may be designated by MRS or in initial state. The initial state refers to a test process of the memory device 41 after fabricated or an initialization sequence of the memory device 41. A simple selection circuit may be added to designate the representative data I/O. Encoded data may be one of the examples of the processed data. One of the encoded data is mean value of the sampled write training data from data I/Os.

Figure 11:
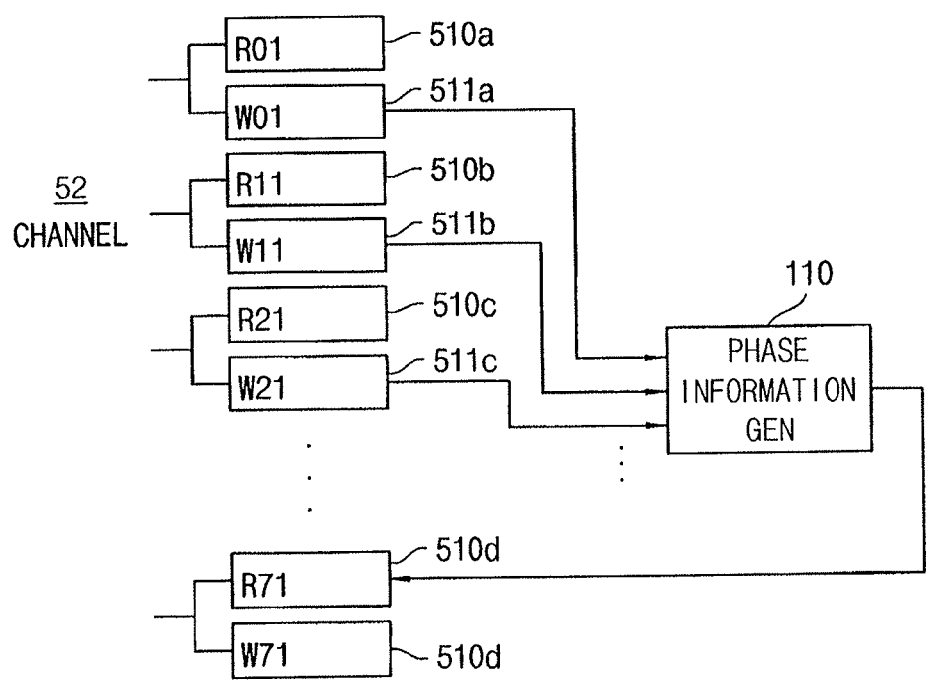
FIG. 11 is a block diagram illustrating a memory device according to an embodiment.

FIG. 11 is a block diagram illustrating a memory device according to an embodiment.

Referring to FIG. 11, the memory device 51 may include read data storages 510*a*~510*d*, write data storages 511*a*~511*d* and a phase information generator 110. A memory core and a phase controller are omitted. A channel 52 may include data I/Os and write clock WCK I/Os. The channel 52 may interface between the memory device 51 and a memory controller (not shown) for transferring data, command, and address.

Write training data transferred from a CPU core (not shown) may be stored in a write data storage in the memory controller. The write training data may be stored in write data storages 511*a*~511*d* through data I/Os and transferred to the phase information generator 110. The phase information generator 110 may extract or select phase information from the write training data in each write data storage 511*a*~511*d*. Phase information may be loaded to a designated data I/O and transferred to the memory controller.

The phase information generator 110 may generate representative phase information to be transmitted to the memory controller. Representative phase information may be calculated by an arithmetic formula for example, a mean value calculation of sampled write training data. Representative phase information may be selected from sampled write training data according to the reliability of the phase change representative. Representative phase information may be chosen from sampled write training data according to the data I/O reliability information. Phase information may include phase skew information between data I/Os. When phase information includes phase skew information, the phase information generator 110 may extract a phase skew using a functional circuit such as a phase detector. The functional circuit may be additionally included in the memory device 51.

Figure 12:
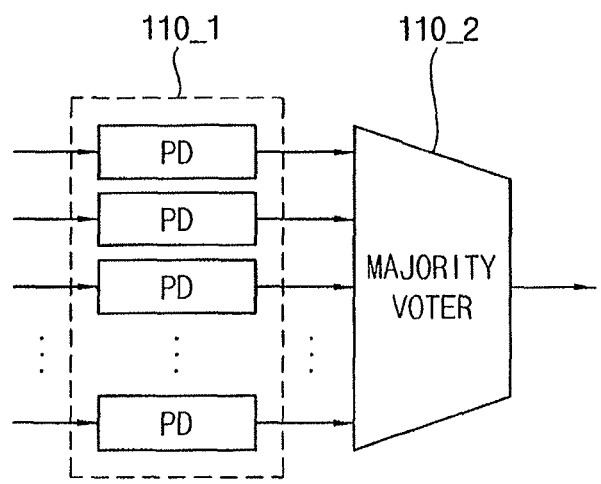
FIG. 12 is a block diagram illustrating a phase information generator according to an embodiment.

FIG. 12 is a block diagram illustrating a phase information generator according to an embodiment.

Referring to FIG. 12, the phase information generator 110 may include a phase detector 110_1 and a majority voter 110_2. The phase detector 110_1 may include one or more phase detecting unit PD. When the phase detector 110_1 in comprised by one phase detecting unit PD, the phase detecting unit PD may comprise data I/Os. When the phase detector 110_1 includes a plurality of phase detecting units, each phase detecting unit PD may include respectively allocated data I/Os. When phase information does not include skew information, phase detector 110_1 can be omitted.

The majority voter 110_2 may choose representative phase information among the phase information input. Phase information may include processed information or un-processed information. For example, when the number of data having "1" more than number of data having "0", majority voter 110_2 may output "1". The majority voter 110_2 may be substituted by a selector or a mean value calculator and so on.

Decision for whether to perform data training may be dependent on another method. For example, a memory or a memory controller may compare detected information with an expected data pattern. When they have same value, the output may be "1" and the write data training may be omitted. When they have different value, the output may be "0" and the write data training may be performed. The 'detected information' may include processed or un-processed data.

Figure 13:
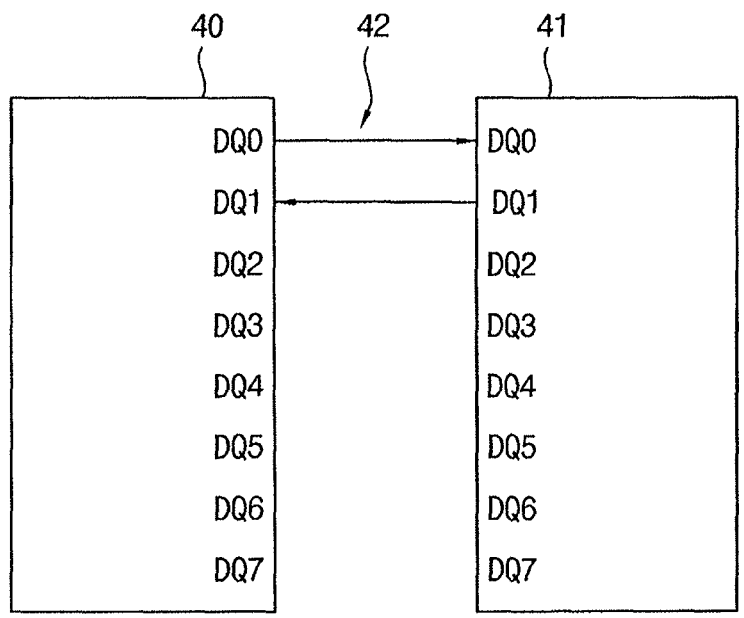
FIG. 13 is a block diagram illustrating a memory system according to an embodiment.

FIG. 13 is a block diagram illustrating a memory system according to an embodiment.

Referring to FIG. 13, a memory system may include a memory controller 40 and a memory device 41. The memory controller 40 and the memory device 41 may communicate data through a channel 42. The channel 42 may include data pins DQ0~DQ7. The channel 42 may include an address channel, an clock channel and an command channel. The channel 42 may include physical or spatial connections of pins for transferring data, clock and command. Data I/Os connecting the pins DQ0~DQ7 may include bidirectional I/O.

The memory controller 40 may transmit write training data to the memory device 41 through a representative data I/O DQ0. The memory device 41 may re-transfer sampled write training data to the memory controller 40 through a representative data I/O DQ1. The memory controller 40 may adjust skew of data I/Os DQ0~DQ7 with reference to the information re-transferred by the data I/O DQ1. Representative data I/Os DQ0 and DQ7 may be designated by MRS or in initial state. The initial state refers to a test process of the memory device 41 after fabricated or an initialization sequence of the memory device 41. A simple selection circuit may be added to designate the representative data I/O. Use of two data I/Os may reduce current consumption for the data write training sequence. The representative data I/O may be changeable on the basis of initialization information about the data I/O status using a MRS.

Figure 14:
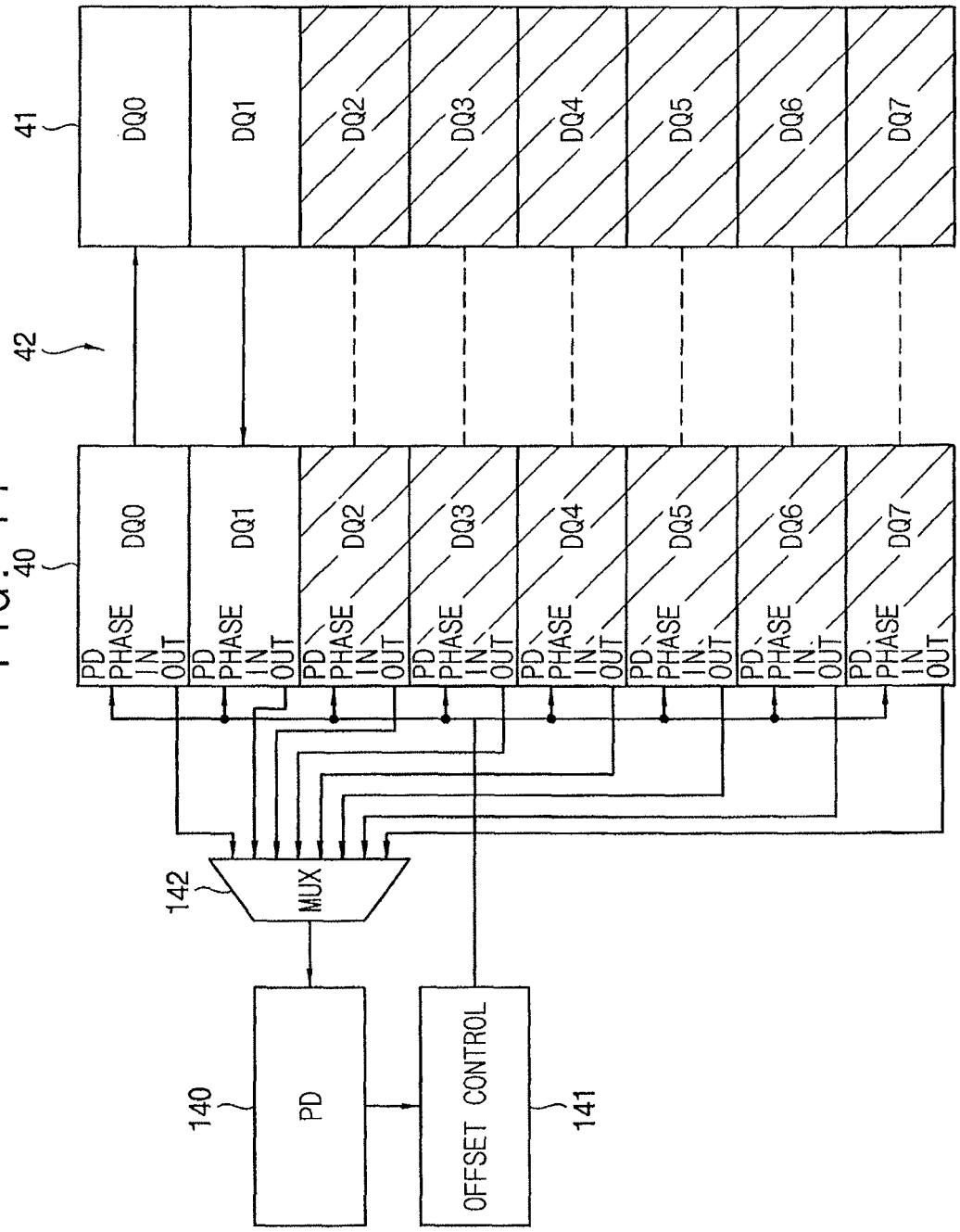
FIG. 14 is a block diagram illustrating the memory system in FIG. 13 according to an embodiment.

FIG. 14 is a block diagram illustrating a memory system according to an embodiment.

Referring to FIG. 14, a memory controller 40 may transmit write training data to a memory device 41 through a data I/O DQ0. The memory device 41 may re-transfer a sampled write training data to the memory controller 40 through an internal data path. As above-described, the data write training may complete by a write training command without an additional read training command.

The multiplexer 142 may select re-transferred writing training data to be input to a phase detector 140. The multiplexer 142 may be located at the input stage of the memory controller 40 or output stage of the memory device 41 and may select the sampled write training data to be re-transferred through data I/Os DQ0~DQ7. When representative data I/Os DQ0, DQ1 are used for the data write training, the multiplexer 142 may be changeable to a buffer.

The phase detector 140 may detect a skew or an offset from the re-transferred sampled write training data. The offset controller 141 may compensate the skew. The skew may be caused by a phase difference between data I/Os. The phase detector 140 and/or the offset controller 141 may be located in the memory device 41.

The memory device 41 may include capacitive memories, resistive memories or other memories. The capacitive memories may include DRAM (Dynamic Random Access Memory), FRAM (Ferroelectric Random Access Memory) and SRAM (Static Random Access memory). The resistive memories may include PRAM (Phase change Random Access Memory), RRAM (Resistance Random Access Memory) and MRAM (Magnetic Random access Memory). Other memories may include NFGM (Nano Floating Gate Memory) and PoRAM (Polymer Random Access Memory).

Figure 15:
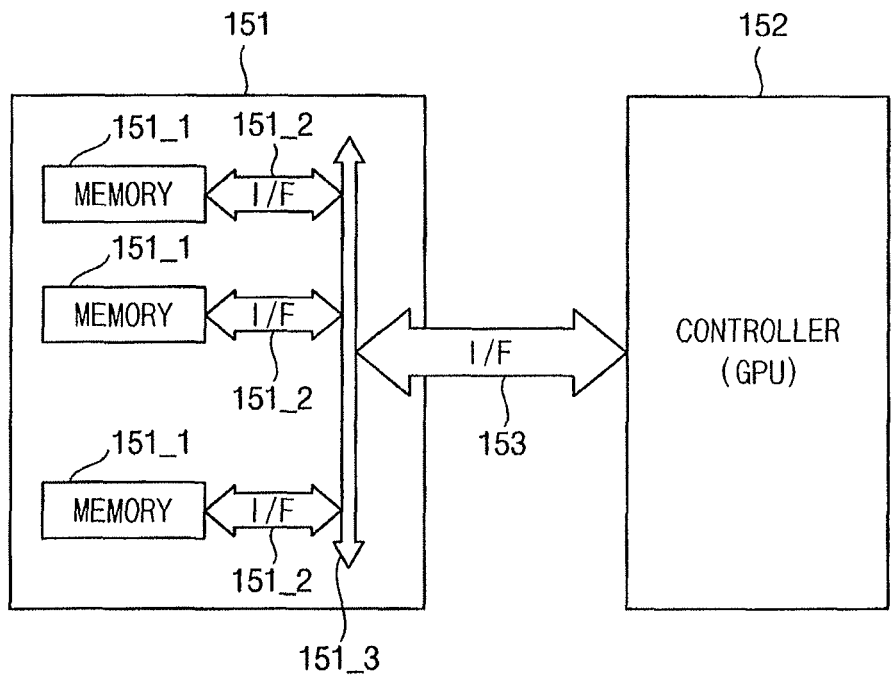
FIG. 15 is a block diagram illustrating a graphic memory system according to an embodiment.

FIG. 15 is a block diagram illustrating a graphic memory system according to an embodiment.

Referring to FIG. 15, the graphic memory system 150 may include a memory group 151, a controller 152 (GPU) and a system bus 153. The memory group 151 may be called as a memory module that includes a plurality of memory device 151_1 on a printed circuit board, with each of the memory devices being implemented as discussed above with respect to the memory device. Moreover each of the memory devices may be coupled with the controller 152 (GPU) through the system bus 153. Internal interfaces 151_2 and a memory interface 151_3 may be disposed between the system bus 152 and the memory devices 151_1.

The controller 152 (GPU) may include a engine core. The controller 152 (GPU) may perform a data write training by transmitting and receiving write training data through each memory device 151_1, system bus 153, memory interface 151_2 and internal interface 151_3 responsive to a write training command. The system bus 153, the memory interface 151_2 and the internal interface 151_3 may be merged to one I/O. A SERDES (SERializer DESerializer) may be included in the one I/O for converting data format.

Figure 16:
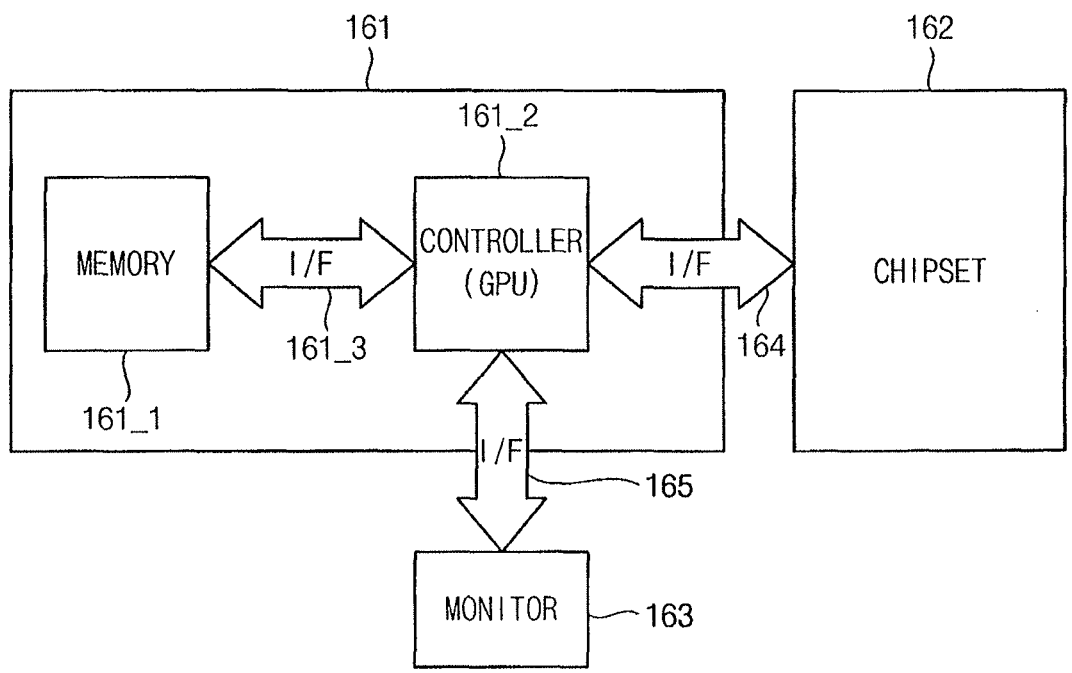
FIG. 16 is a block diagram illustrating a graphic memory system according to an embodiment.

FIG. 16 is a block diagram illustrating a graphic memory system according to an embodiment such as serial to parallel or parallel to serial.

Referring to FIG. 16, the graphic memory system 160 may include a graphic memory card 161, a chipset 162 and a monitor 163. The graphic card 161 may include a memory device 161_1, a controller 161_2 (GPU) and a system bus 161_3 on a printed circuit board with the memory device 161_1 being implemented as discussed above with respect to the memory device of FIG. 2, FIG. 4~FIG. 7 and FIG. 10~FIG. 14 and/or the memory device may be implemented as a module of the memory device as discussed above with respect to FIG. 15.

The controller 161_2 (GPU) may perform graphics processing to render graphics on the monitor 163 using a first interface 165 responsive to instructions received from the chipset 162 through a second interface 164. The controller 161_2 (GPU) may also interface with the memory device 161_1 using functionalities described above with respect to the memory controller of FIG. 2, FIG. 4~FIG. 7 and FIG. 10~FIG. 14 to facilitate graphics processing. The first and second interface 164, 165 may include at least selected one from a group of USB (Universal Serial Bus), MMC (Multi-Media Card), PCI-E (Peripheral Component Interconnect-Express), SAS (Serial-attached SCSI), SATA (Serial Advanced Technology Attachment), PATA (Parallel Advanced Technology Attachment), SCSI (Small Computer System Interface), ESDI (Enhanced Small Disk Interface), and IDE (Integrated Drive Electronics).

Figure 17:
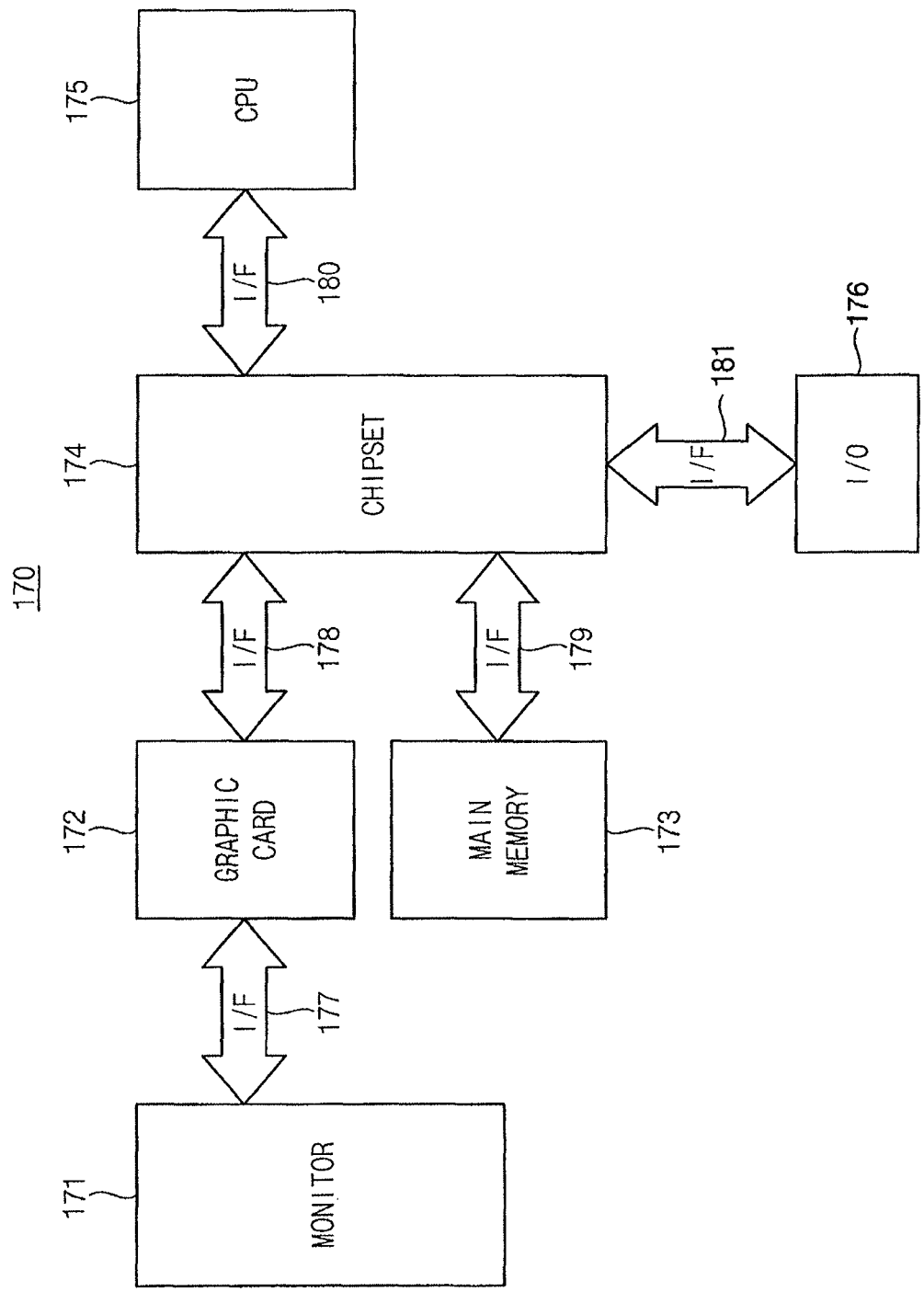
FIG. 17 is a block diagram illustrating a computing system according to an embodiment.

FIG. 17 is a block diagram illustrating a computing system according to an embodiment.

Referring to FIG. 17, the computing system 170 may be implemented using a chipset 174 coupled to a main memory 173 including one or more memory devices implemented as discussed above with respect to memory device of FIG. 2, FIG. 4~FIG. 7 and FIG. 10~FIG. 14 and/or as discussed above with respect to the memory module including memory device of FIG. 15. The chipset 174 may provide an interface between a central processing unit 175, a graphics card 172, and an input/output device 176 (such as keyboard). The graphics card 172 may be used to render graphics on a monitor 171 as discussed above with respect to FIG. 16. Moreover, memory controller functionality may be provided by the chipset 174 and/or the central processing unit 175 interfacing with the main memory 173.

According to example embodiments, when the computing system 170 is a mobile device, a modem for applying an operation voltage of the computing system 170, e.g., a battery or a base-band chipset may further be included. Also, the computing system 170 may further include, e.g., an application chipset, a camera image processor, a mobile DRAM, and so on. Thus, detailed descriptions thereof will not be repeated. The memory controller and the memory device may form, e.g., a solid state drive/disk (SSD) that uses non-volatile memory for storing data.

The computing system or the semiconductor memory device may be mounted using packages, for example, PoP (Package on Package), BGA (Ball Grid Array), CSPs (Chip Scale Packages), PLCC (Plastic Leaded Chip Carrier), PDIP (Plastic Dual In-line Package), DWP (Die in Waffle Pack), DWF (Die in Wafer Form), COB (Chip On Board), CERDIP (CERamic Dual In-line Package), MQFP (Plastic Metric Quad Flat Pack), TQFP (Thin Quad FlatPack), SOIC (Small Outline Integrated Chip), SSOP (Shrink Small Outline Package), TSOP (Thin Small Outline Package), TQFP (Thin Quad FlatPack), SIP (System In Package), MCP (Multi Chip Package), WFP (Wafer-level Fabricated Package) and WSP (Wafer-level Processed Stack Package).

By way of summation and review, in a processing unit of a chipset that requires a high-speed data processing, a write training operation is performed to secure stability of the data processing before general data processing is performed.

In the data write training, a first command may be initiated by the processing unit to write the write training data to a memory. Another command may be initiated by the processing unit to read the write training data stored in the memory. When data write training sequence requires two commands initiated by the processing unit, the data write training time may increase.

According to embodiments, by sequentially performing data communications for a data write training, a time required to train write data may be reduced without using an additional read data training command. Moreover, data reliability may be enhanced because of accurate write data training.

Exemplary embodiments have been disclosed herein, and although specific terms are employed, they are used and are to be interpreted in a generic and descriptive sense only and not for purpose of limitation.

What is claimed is:

1. A method of operating a semiconductor device, comprising:
    transmitting a first data training command;
    transmitting a first data responsive to the first data training command through a first data line;
    receiving the first data through a second data line; and
    compensating a phase difference between data lines using the received first data.

2. The method as claimed in claim 1, wherein receiving the first data is performed without an additional data training command.

3. The method as claimed in claim 1, further comprising, after compensating the phase difference, transmitting a second data training command; transmitting a second data responsive to the second data training command through the second data line; and receiving the second data through the first data line.

* * * * *